United States Patent
Hsieh et al.

(10) Patent No.: US 6,847,010 B1
(45) Date of Patent: Jan. 25, 2005

(54) METHODS AND CIRCUITS FOR MEASURING THE THERMAL RESISTANCE OF A PACKAGED IC

(75) Inventors: Steven H. C. Hsieh, Cupertino, CA (US); Siuki Chan, Cupertino, CA (US)

(73) Assignee: Xilinx, Inc., San Jose, CA (US)

( * ) Notice: Subject to any disclaimer, the term of this patent is extended or adjusted under 35 U.S.C. 154(b) by 61 days.

(21) Appl. No.: 10/310,494

(22) Filed: Dec. 4, 2002

(51) Int. Cl.[7] .............................................. H05B 1/00
(52) U.S. Cl. ...................... 219/209; 219/497; 219/210; 374/43; 374/44
(58) Field of Search .............................. 219/209, 497, 219/210; 374/43, 44

(56) References Cited

U.S. PATENT DOCUMENTS

| | | | | |
|---|---|---|---|---|
| 4,165,642 A | * | 8/1979 | Lipp | 374/170 |
| 4,593,208 A | * | 6/1986 | Single | 327/539 |
| 4,840,495 A | * | 6/1989 | Bonnefoy | 374/43 |
| 5,233,161 A | * | 8/1993 | Farwell et al. | 219/209 |
| 5,309,090 A | * | 5/1994 | Lipp | 324/158.1 |
| 5,690,849 A | * | 11/1997 | DeVilbiss et al. | 219/497 |
| 5,798,502 A | * | 8/1998 | Comer | 219/497 |
| 5,886,564 A | * | 3/1999 | Sato et al. | 327/513 |
| 5,896,259 A | * | 4/1999 | Farwell et al. | 361/78 |
| 5,910,659 A | * | 6/1999 | Johnson et al. | 250/495.1 |
| 6,097,179 A | * | 8/2000 | Ray et al. | 323/312 |
| 6,266,962 B1 | * | 7/2001 | Ghoshal | 62/3.7 |

OTHER PUBLICATIONS

Xilinx, Inc., Virtex–II 1.5V Field–Programmable Gate Arrays, Nov. 29, 2001, pp. 1–39, DS031–2 (v1.9), Xilinx, Inc. 2100 Logic Dr., San Jose, CA., 95124.

* cited by examiner

Primary Examiner—Robin O. Evans
Assistant Examiner—Vinod Patel
(74) Attorney, Agent, or Firm—Arthur J. Behiel; Edel M. Young; Justin Liu

(57) ABSTRACT

Disclosed is a DC thermal energy generator for heating localized regions of an integrated circuit. The integrated circuit includes a pair of static circuits whose outputs are shorted, and are in contention. Contention causes current to flow through the circuits, generating heat. Integrated-circuit temperatures can be varied by turning on more or fewer thermals energy generators. The thermal resistance of a, packaged integrated circuit is computed using a well-known relationship integrated circuit's measured temperature, power consumption, and the ambient temperature.

11 Claims, 3 Drawing Sheets

METHODS AND CIRCUITS FOR MEASURING THE THERMAL RESISTANCE OF A PACKAGED IC

FIELD OF THE INVENTION

The invention relates generally to methods and circuits for measuring the thermal resistance of packaged integrated circuits.

BACKGROUND

The operating temperature of an integrated circuit (IC) affects both the life and the speed performance of the IC. Higher internal operating temperatures will shorten the life of an IC; elevated but safe temperatures often reduce the quality of performance in a circuit, for instance degrading frequency response or increasing distortion. Hence, manufacturers specify IC performance at a particular temperature and power consumption. IC users must then ensure adequate cooling to maintain their ICs within an acceptable range of temperatures.

Modern miniature IC packages allow great space savings in products by allowing more ICs to be placed on a given area of a printed circuit board (PCB). Unfortunately, high IC densities concentrate heat generated by the ICs into smaller spaces. This concentration of heat exacerbates the problem of ensuring adequate cooling. To make matters worse, ever increasing IC speeds and complexities promise to generate still more heat in still smaller spaces. Such problems demand careful attention in designing effective thermal management schemes.

A packaged IC comprises a semiconductor die enclosed within a package (e.g., a PLCC or BGA package) and leads that transmit signals to and from the die through the package. "Thermal resistance" is an important parameter in designing effective thermal management schemes for ICs. The thermal resistance of an IC mounted on a PCB (i.e., the "mounted thermal resistance") represents the ability of the package to conduct heat away from the IC die through the package and package leads and into the surrounding environment. Mounted thermal resistance ($\theta_{JA}$) of a packaged IC varies with die size, package type, and circuit board features, and can be computed using a well-known relationship among IC temperature, power consumption, and ambient temperature.

Various methods are used to estimate mounted thermal resistance of a packaged IC. These methods include resistive heating of a thermal test chip, thermal simulation of the packaged IC, and AC activity heating of the packaged IC. The thermal-test-chip method utilizes a packaged thermal die of a different type but of the same size as the actual packaged IC die. The thermal die has an on-chip temperature sensor for determining die temperature and resistors that resistively heat the thermal die.

The thermal-test-chip method of determining thermal resistance can be imprecise for a number of reasons. For example, the physical profile of an IC die is non-uniform. Non-uniform profiles drastically affect the way heat is transmitted through the die, and hence how the package conducts heat away from the die and into the environment; the thermal-test-chip method does not take this into account. Similarly, other differences between the form and function of the thermal test chip and the IC of interest can introduce measurement errors.

Thermal simulation of an IC and the board environment is another method that can be used to determine the thermal resistance of packaged ICs. Thermal simulation method is fast but can result in grossly erroneous thermal resistance values because of the difficulty of forming accurate models.

Some methods of measuring thermal resistance of a packaged IC use AC activity on the IC to heat the die. Such methods require a substantial portion of the IC be activated. This method has two major flaws: one, it can be difficult to produce uniform AC activity across the IC and, as a result, some regions of the IC may be at a higher temperature than others; two, AC activity causes substantial power fluctuations, which can introduce errors in the measurement of power consumed by the IC.

In light of the foregoing, there exists a need for a method of accurately determining the thermal resistance value of a packaged IC.

SUMMARY

The present invention addresses the need of IC manufactures to provide accurate thermal resistance values for packaged ICs. Manufacturers can then provide these values to system PCB layout designers for use in developing better thermal management schemes. In accordance with one embodiment, thermal energy generators are instantiated on a PLD and used to heat the PLD die to a target temperature. The PLD's thermal resistance is then computed using a well-known relationship among die temperature, power consumption, and ambient temperature.

In some embodiments, the thermal energy generators use DC (direct current) to elevate the die temperature. These embodiments reduce the impact of the thermal energy generators on power-supply fluctuations, and consequently provide for more accurate determinations of thermal resistance.

The allowed claims, and not this summary, define the scope of the invention.

DETAILED DESCRIPTION

Figure 1:
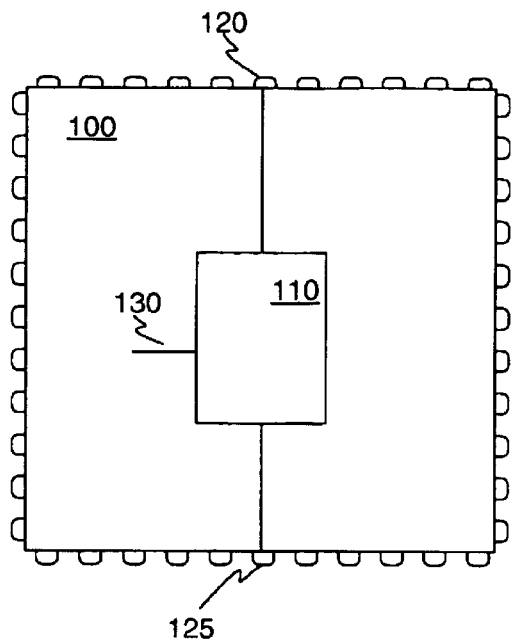
FIG. 1 is a diagram of a packaged integrated circuit 100 with a block diagram of a thermal energy generator 110.

FIG. 1 depicts a packaged integrated circuit (IC) 100, which includes an on-chip thermal energy generator 110 powered by a first power-supply terminal 120 and a second power-supply terminal 125. A voltage applied on a control terminal 130 controls thermal energy generator 110 (i.e., turns generator 110 on and off) to selectively heat IC 100 to a target temperature. Once heated, the temperature of IC 100 can then be used with the power consumed by IC 100, and the ambient temperature to compute the thermal resistance of IC 100.

In accordance with the present embodiment, generator 110 generates heat when control terminal 130 is set to a voltage level representative of a logic one, which establishes a current conduction path between the first and second power-supply terminals. Thus controlled, generator 110 is said to be in a conductive state, typically known as the "ON" state. When on, thermal energy generator 110 conducts a relatively constant current (i.e., DC current). Returning control terminal 130 to a logic zero turns off generator 110, eliminating the current conduction path between first and second power terminals 120 and 125. (Of course, the voltage levels used to control generator 110 can be reversed.) The control signal for control terminal 130 can be provided on IC 100 or from an external source.

The power consumed by IC 100, at a constant supply-voltage, is directly proportional to the current drawn from the power-supply. Hence, the power consumed by IC 100 can be increased or decreased by turning on more or fewer generators 110 without changing the supply-voltage. Resistor circuits can be used to implement thermal generator 110. However, resistor circuits require large die area, and once designed are difficult to adapt for other uses. For these reasons, other types of static thermal generators are preferred. Embodiments employing such static generators are described below.

Figure 2:
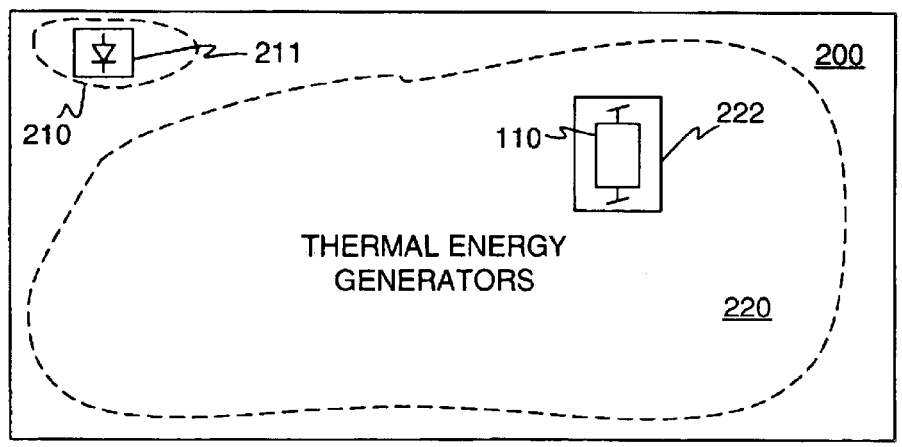
FIG. 2 is a block diagram of an integrated circuit 200 showing a spatial distribution of thermal heat generators and a temperature-sensing circuit.

FIG. 2 depicts a programmable logic device (PLD) 200, which includes a first region 210 and a second region 220. PLD 200 includes a number of thermal energy generators. These generators heat PLD 200 to perform thermal-resistance measurements in accordance with one embodiment of the invention.

First region 210 includes a temperature sensor 211, typically a diode. Second region 220 includes programmable logic resources configured to instantiate a number of thermal energy generators 222 similar to thermal generator 110 of FIG. 1. Distributing thermal energy generators across the PLD ensures uniform heating of the die, and minimizes the thermal gradient across the programmable logic device. The temperature recorded by temperature sensor 211 is preferably close to the average temperature of region 220. The temperature of PLD 200 is conventionally determined by relating the voltage drop across sensor 211 to temperature.

Once heated, the thermal resistance $\Theta_{JA}$ of packaged PLD 200 is computed using the following well-known relationship:

$$\Theta_{JA} = \frac{(T_{PLD} - T_A)}{P_{PLD}}$$

where $T_{PLD}$ is the temperature of the PLD die, $P_{PLD}$ is the power consumed by PLD 200, and $T_A$ is the measured ambient temperature of the environment.

Figure 3:
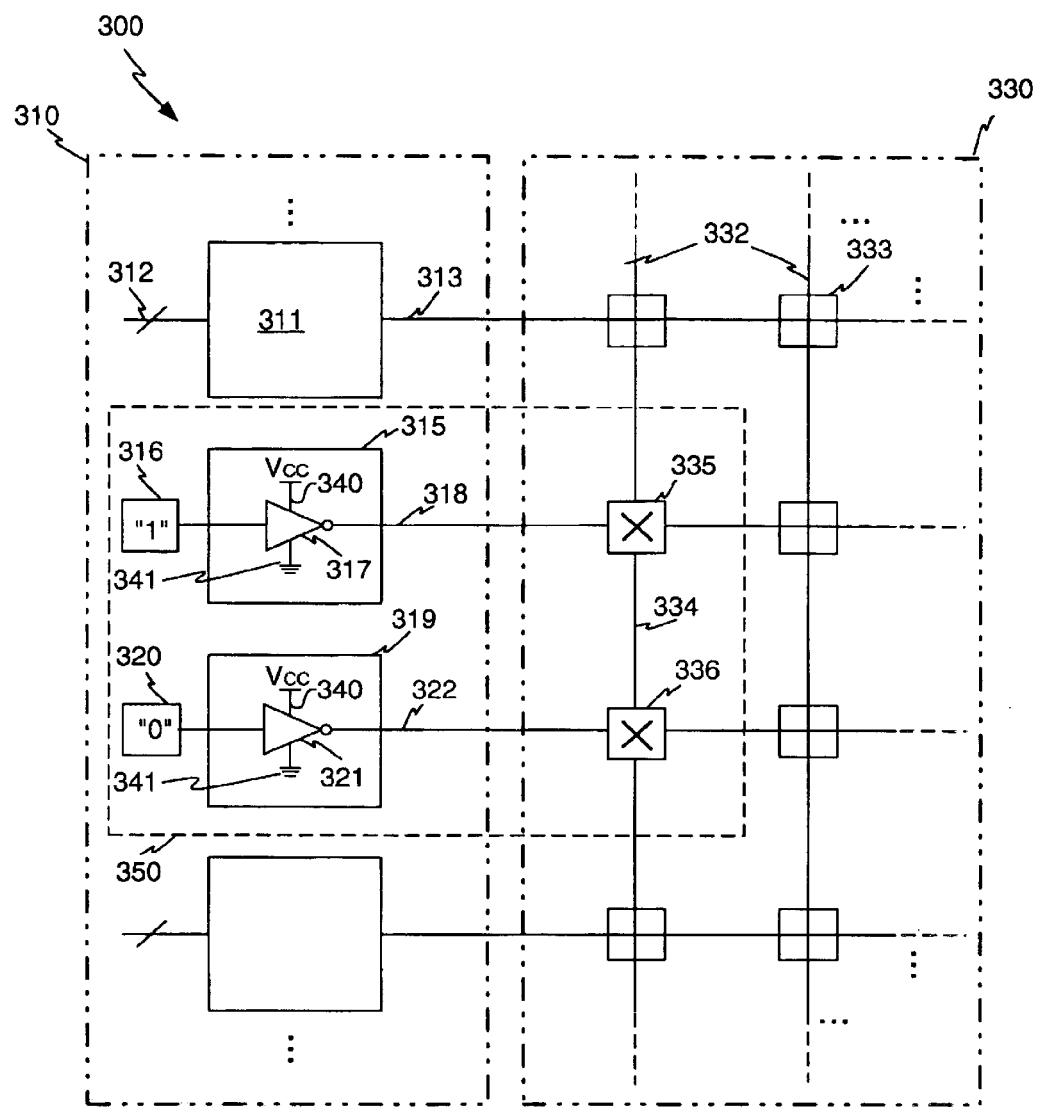
FIG. 3 is a block diagram of some programmable resources 300 available on a programmable logic device.

FIG. 3 depicts some programmable resources 300 available on an embodiment of PLD 200 of FIG. 2. Resources 300 include an array 310 of independent configurable logic elements 311 and programmable interconnects 330. Each configurable logic element 311 can be configured to perform a logic function whose complexity depends on the capacity of the logic element. Two or more logic elements 311 may be combined to perform a more complex logic function. Programmable interconnects 330 provide routing resources to programmably interconnect configurable logic element 311 to other configurable logic elements, and other resources (e.g., I/O, RAM) available on PLD 200 of FIG. 2.

Configurable logic element 311 includes programmable logic resources (e.g., one or more look-up tables), at least one input terminal 312, and at least one output terminal 313. Programmable interconnect resources 330 include programmable interconnect points (PIPs) 333 and interconnection paths 332. As is conventional, PIPs 333 can be programmed to provide electrical contact between two different interconnection paths 332.

Some of PIPs 333 programmably connect output terminals 313 to interconnection paths 332. Output terminals 313 can therefore be connected to one another via programmable interconnect resources 330. Input terminals 312 can be driven by an external source (not shown) or using internally generated signals. Some PLD architectures provide methods of programming configurable logic elements 311 to output a desired logic level in the absence of an input signal on an associated input terminal 312. In such cases, powering up the PLD causes the respective output terminal 313 to be driven to the desired logic level.

In accordance with the current embodiment, configurable logic element 315 is configured to be a first gate with a first output terminal 318. The configuration of gate 315 performs an inversion (a "NOT" logic function) represented as an inverter 317. Inverter 317 is powered by a first power-supply terminal (VCC) 340, and a second power-supply terminal (GND) 341. Input terminal 316 of configurable element 315 is programmed to a first logic level 11, "1," hence associated output terminal 318 is driven to a second logic level "0". Similarly, an adjacent configurable logic element 319 is configured to be a second gate 321, also an inverter in this example, with a second output terminal 322. Inverter 321 is powered by first and second power-supply terminals 340 and 341. Input terminal 320 is programmed to be a logic zero, hence associated output terminal 322 is driven to a logic one. Output terminals 318 and 322 connect to interconnection path 334 via programmed PIPs 335 and 336, respectively. As such, output terminals 318 and 322 are shorted together.

Shorting the output of inverter 317 with the output of inverter 321 creates an electrical conduction path between terminal 340 and terminal 341. Thus, when power is applied to the PLD, current flows through gates 317 and 321 and the intervening interconnect resources. Configured in this way, gates 317 and 321 and the intervening resources define a DC thermal energy generator (DC heater) 350.

Figure 4:
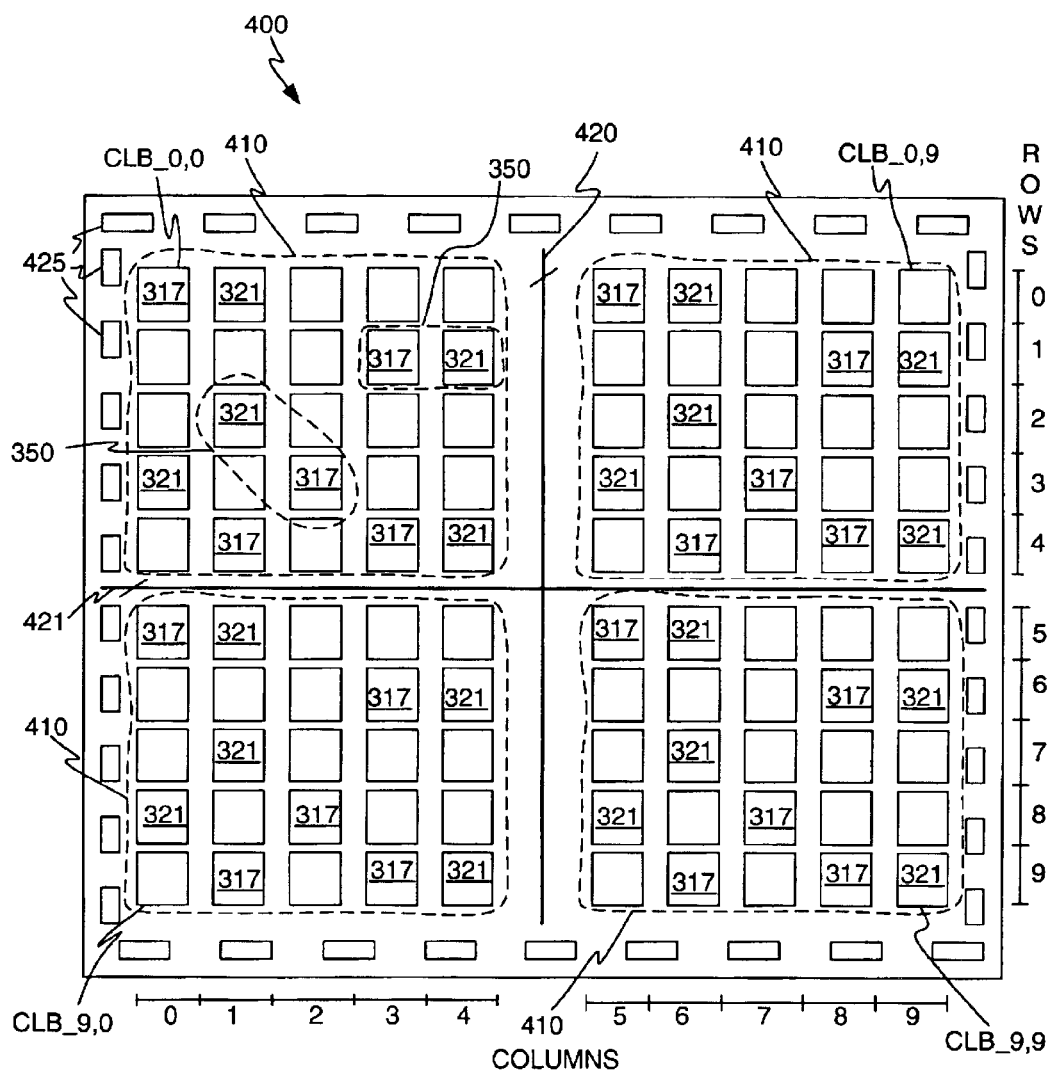
FIG. 4 is a block diagram of an embodiment of FPGA 400.

FIG. 4 is a block diagram of an embodiment of a conventional FPGA 400 configured to include a number of thermal-energy generators. FPGA 400 is similar to PLD 300 of FIG. 3, like-numbered elements being the same. FPGA 400 includes a matrix of 100 (10 rows by 10 columns) identical configurable logic blocks (CLBs) CLB_0,0 to CLB_9,9 surrounded by input/output blocks (IOBs) 425. Vertical and horizontal programmable interconnects 420 and 421, respectively, span the CLBs and IOBs.

The matrix of CLBs is split into four equal regions 410. Each region 410 in turn includes a number of DC heaters 350 of the type described in connection with FIG. 3. For illustrative purposes, each region 410 is shown to have the same number of DC heaters 350, though this need not be the case. However, an even distribution of DC heaters 350 allows for even heating of FPGA 400. The amount of heat generated depends on the number of thermal generators programmed on the die; higher temperatures require more thermal energy generators, while lower temperatures require fewer thermal generators. In the example, each DC heater 350 includes a pair of configurable elements 317 and 321 (See FIG. 3): the remaining configurable logic elements are assumed to be unconfigured.

While FPGA 400 is shown to include 100 configurable logic elements, other FPGAs are available for applications that demand different number of configurable logic elements. For example, the XC4013™ device, available from Xilinx, Inc., includes a matrix of 576 (24 rows by 24 columns) configurable logic elements.

While the present invention has been described in connection with specific embodiments, variations of these embodiments will be obvious to those of ordinary skill in the art. For example, implementation of the invention is not limited to FPGAS, or even PLDS, but may be implemented in non-programmable logic ICs, as where one or more DC thermal energy generators are included in the design of an IC. Additionally, application of the present invention is not limited to the current embodiment, but may be used to heat localized areas in other types of ICs. Further, the DC thermal energy generator may be implemented in any number of ways, including by any kind of logic gates in any kind of combination (e.g., NAND-NAND, NAND-OR, and so on). The pair of gates can be in different spatial proximity (e.g., the gates could be in the same or different regions of the PLD) depending on available programmable resources, or application of the invention. Those of skill in designing ICs can adapt the present invention for use in many ICs. Moreover, different types of PLDs include different types of logic elements (e.g., macrocells, logic cells, configurable logic blocks, and so on), and interconnect resources, but can nevertheless implement the present invention. Therefore, the spirit and scope of the appended claims should not be limited to the foregoing description.

What is claimed is:

1. An integrated circuit comprising:
   a. a first power-supply terminal adapted to provide a first power-supply voltage;
   b. a second power-supply terminal adapted to provide a second power-supply voltage; and
   c. a DC thermal energy generator for heating a localized area of the integrated circuit, the generator comprising:
      i. a first current-handling terminal connected to the first power-supply terminal;
      ii. a second current-handling terminal connected to the second power-supply terminal;
      iii. a control terminal; and
      iv. a pair of configurable logic elements.

2. The integrated circuit of claim 1, wherein the pair of configurable logic elements comprise:
   a. a first CMOS gate having a first output terminal; and
   b. a second CMOS gate having a second output terminal.

3. The integrated circuit of claim 2, wherein at least one of the first and second CMOS gates comprises an inverter.

4. The integrated circuit of claim 2, wherein the first CMOS gate outputs a logic voltage level.

5. The integrated circuit of claim 4, wherein the logic voltage level is a first logic voltage level, and wherein the second CMOS gate outputs a second logic voltage level.

6. The integrated circuit of claim 2, wherein the output terminal of the first CMOS gate is shorted to the output terminal of the second CMOS gate.

7. The integrated circuit of claim 2, wherein the second output terminal voltage level is equivalent to the first power-supply voltage.

8. The integrated circuit of claim 2, wherein the two CMOS gates are in spatial proximity.

9. A method of heating a programmable logic device to each of a first temperature and a second temperature, the programmable logic device having configurable logic elements and configurable interconnect lines, the method comprising:
   a. configuring the configurable logic elements and configurable interconnect lines in the programmable logic device to include a first number of thermal energy generators;
   b. powering the first number of thermal energy generators;
   c. allowing the programmable logic device to reach the first temperature;
   d. configuring the configurable logic elements and configurable interconnect lines in the programmable logic device to include a second number of thermal energy generators;
   e. powering the second number of thermal energy generators; and
   f. allowing the programmable logic device to reach the second temperature.

10. The method of claim 9, wherein the first temperature is less than the second temperature.

11. The method of claim 9, wherein powering the first number of thermal energy generators includes applying a supply voltage to the first number, and wherein powering the second number of thermal energy generators includes applying the supply voltage to the second number.

* * * * *